(12) United States Patent
Gagne et al.

(10) Patent No.: US 8,710,900 B2
(45) Date of Patent: Apr. 29, 2014

(54) METHODS AND APPARATUS FOR VOLTAGE SELECTION FOR A MOSFET SWITCH DEVICE

(75) Inventors: Nickole Gagne, Saco, ME (US); Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/427,481

(22) Filed: Mar. 22, 2012

(65) Prior Publication Data

US 2013/0249621 A1 Sep. 26, 2013

(51) Int. Cl.
*H03K 17/687* (2006.01)

(52) U.S. Cl.
USPC .............................. 327/434; 327/419; 327/427

(58) Field of Classification Search
USPC .................................................. 327/365–508
See application file for complete search history.

(56) References Cited

U.S. PATENT DOCUMENTS

| | | | |
|---|---|---|---|
| 5,914,632 A * | 6/1999 | Fotouhi et al. ................ | 327/537 |
| 6,150,845 A | 11/2000 | Morrill | |
| 6,163,199 A | 12/2000 | Miske et al. | |
| 6,344,958 B1 | 2/2002 | Morrill | |
| 6,538,867 B1 | 3/2003 | Goodell et al. | |
| 6,696,880 B2 * | 2/2004 | Pan et al. ...................... | 327/390 |
| 6,731,486 B2 | 5/2004 | Holt et al. | |
| 6,774,675 B1 | 8/2004 | Miske et al. | |
| 7,049,767 B2 | 5/2006 | Wilhelm | |
| 7,274,242 B2 * | 9/2007 | Farjad-rad .................... | 327/382 |
| 7,840,181 B2 * | 11/2010 | Umeda et al. ................ | 455/41.1 |
| 8,004,340 B2 * | 8/2011 | Guo et al. ..................... | 327/333 |
| 8,279,568 B2 | 10/2012 | Stultz et al. | |
| 2005/0184792 A1 * | 8/2005 | Kim .............................. | 327/437 |
| 2005/0285661 A1 | 12/2005 | Wittenbreder, Jr. | |
| 2008/0198667 A1 * | 8/2008 | Hosomura et al. ........ | 365/185.25 |
| 2011/0199146 A1 * | 8/2011 | Bakalski et al. ............. | 327/427 |
| 2011/0255203 A1 | 10/2011 | Stultz et al. | |
| 2012/0119815 A1 * | 5/2012 | Choi ............................. | 327/407 |
| 2012/0206845 A1 | 8/2012 | Gagne et al. | |

* cited by examiner

*Primary Examiner* — Lincoln Donovan
*Assistant Examiner* — Brandon S Cole
(74) *Attorney, Agent, or Firm* — Brake Hughes Bellermann LLP

(57) ABSTRACT

In one general aspect, an apparatus including a first voltage rail, and a second voltage rail. The apparatus includes a first P-type metal-oxide-semiconductor field effect transistor (MOSFET) PMOS device between the first voltage rail and the second voltage rail where the first PMOS device is configured to electrically couple the first voltage rail to the second voltage rail in response to the first PMOS device being activated. The apparatus can also include a second PMOS device configured to provide a charge pump voltage produced by a charge pump device to the second voltage rail in response to the second PMOS device being activated and the first PMOS device being deactivated. The apparatus can also include a pass gate, and a driver circuit coupled to the pass gate and configured to operate based on a voltage of the second voltage rail.

23 Claims, 8 Drawing Sheets

METHODS AND APPARATUS FOR VOLTAGE SELECTION FOR A MOSFET SWITCH DEVICE

TECHNICAL FIELD

This description relates to methods and apparatus related to an improved metal-oxide-semiconductor field-effect transistor (MOSFET) switch device.

BACKGROUND

Known metal-oxide-semiconductor field-effect transistor (MOSFET) switch devices can have an on-resistance and/or an on-capacitance that can affect the functionality of the MOSFET switch devices in an undesirable fashion. For example, a MOSFET switch device with a relatively high on-resistance and/or a relatively high on-capacitance can attenuate, introduce delay into, or otherwise distort a signal passing-through the MOSFET switch device. The fidelity of a signal controlled at known MOSFET switch devices can be compromised by an undesirable level of on-resistance and/or on-capacitance of the MOSFET switch device. In addition stray leakages within the MOSFET switch device can reduce the overall performance of the MOSFET switch device. Thus, a need exists for systems, methods, and apparatus to address the shortfalls of present technology and to provide other new and innovative features.

SUMMARY

In one general aspect, an apparatus including a first voltage rail, and a second voltage rail. The apparatus includes a first P-type metal-oxide-semiconductor field effect transistor (MOSFET) PMOS device between the first voltage rail and the second voltage rail where the first PMOS device is configured to electrically couple the first voltage rail to the second voltage rail in response to the first PMOS device being activated. The apparatus can also include a second PMOS device configured to provide a charge pump voltage produced by a charge pump device to the second voltage rail in response to the second PMOS device being activated and the first PMOS device being deactivated. The apparatus can also include a pass gate, and a driver circuit coupled to the pass gate and configured to operate based on a voltage of the second voltage rail.

In another general aspect, a method can include electrically coupling, during a first time period and using a first PMOS device, a first voltage rail coupled to a voltage selector to a second voltage rail in response to activation of the first PMOS device. The method can include electrically coupling, during a second time period and using a second PMOS device, a charge pump voltage to the second voltage rail in response to activation of the second PMOS device. The method can also include activating a pass gate coupled to the second voltage rail based on a voltage of the second voltage rail during the second time period.

In yet another general aspect, an apparatus can include a first voltage rail, a second voltage rail, and a pass gate having a gate coupled to the second voltage rail. The apparatus can include a PMOS device coupled between the first voltage rail and the second voltage rail, and a voltage selector coupled to the second voltage rail and configured to apply a voltage from a set of voltages to the gate of the pass gate via the PMOS device and the second voltage rail. The apparatus can also include a charge pump device configured to apply a charge pump voltage to the gate of the pass gate via the second voltage rail.

The details of one or more implementations are set forth in the accompanying drawings and the description below. Other features will be apparent from the description and drawings, and from the claims.

DETAILED DESCRIPTION

Figure 1:
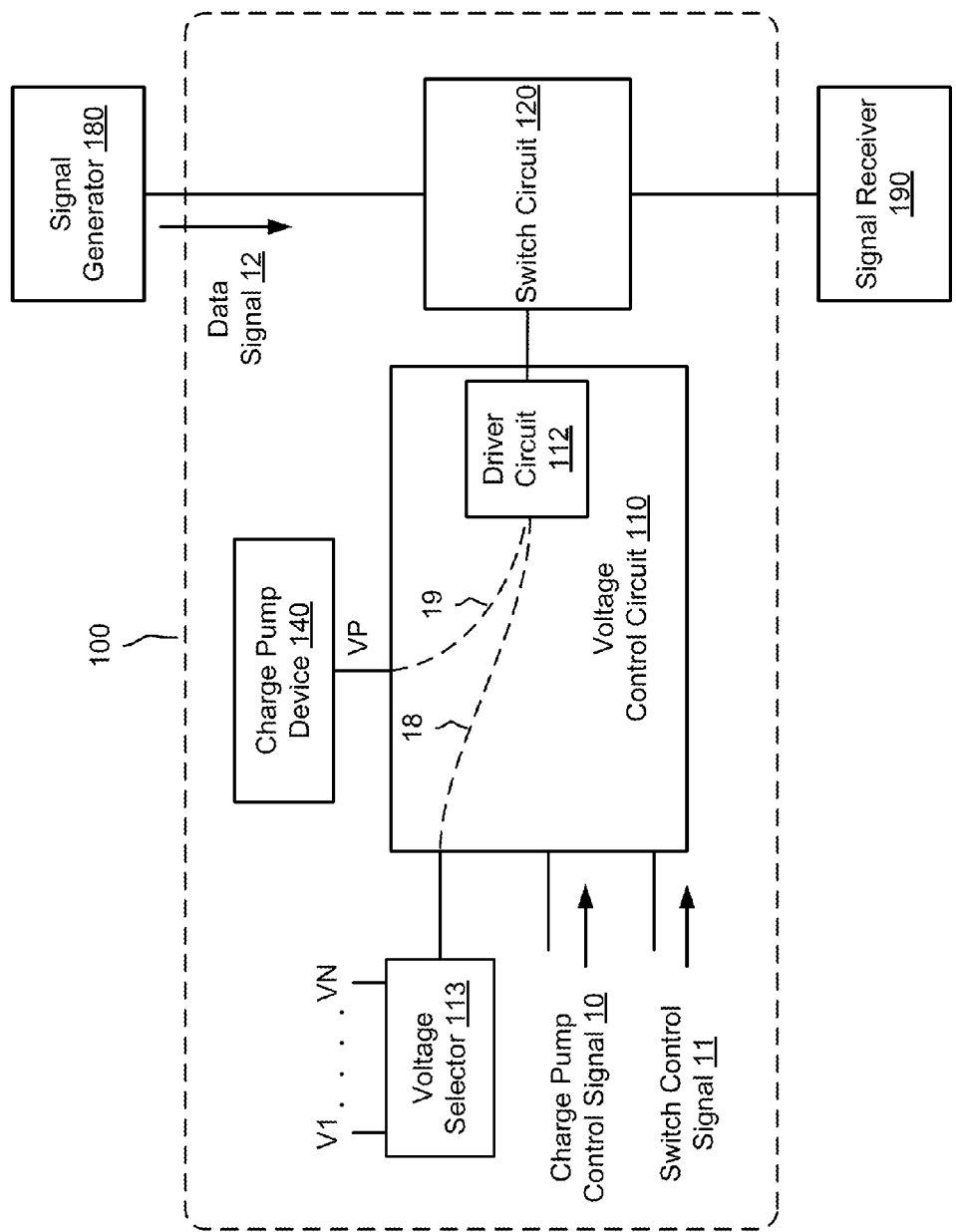
FIG. 1 is a block diagram that illustrates a charge pump switch including a voltage control circuit and a switch circuit, according to an embodiment.

FIG. 1 is a block diagram that illustrates a charge pump switch 100 including a voltage control circuit 110 and a switch circuit 120, according to an embodiment. As shown in FIG. 1, the charge pump switch 100 is coupled to a signal generator 180 and the charge pump switch 100 is coupled to a signal receiver 190. The charge pump switch 100 is configured so that a data signal 12 produced by the signal generator 180 can be passed through the charge pump switch 100 to the signal receiver 190 when (e.g., in response to) charge pump switch 100 is enabled (e.g., turned on, activated, changed to an on-state or pass-through state). The charge pump switch 100 is also configured so that the data signal 12 produced by the signal generator may not be passed through the charge pump switch 100 to the signal receiver 190 when the charge pump switch 100 is disabled (e.g., turned off, high impedance, deactivated, changed to an off-state or cut-off state).

In some embodiments, a portion of the data signal 12 into the charge pump switch 100 (from the signal generator 180) can be referred to as an input portion of the data signal 12 or as an input data signal, and a portion of the data signal 12 out of the charge pump switch 100 (to the signal receiver 190) (not shown) can be referred to as an output portion of the data signal 12 or as an output data signal. In some embodiments, the switch circuit 120 can be referred to as a pass-gate circuit. In some embodiments, the signal generator 180 can be referred to as being coupled to a first node (e.g., terminal) (or input node) of the charge pump switch 100, and the signal receiver 190 can be referred to as being coupled to a second node (or output node) of the charge pump switch 100.

In this embodiment, the charge pump switch 100 can be enabled or disabled in response to a switch control signal 11. In other words, the charge pump switch 100 can be triggered to pass or cut-off a signal produced by the signal generator 180 to the signal receiver 190 in response to the switch control signal 11. The charge pump switch 100 can be enabled when the switch control signal 11 is an enable signal (e.g., an enable signal having a high value or a low value), and the charge pump switch 100 can be disabled when the switch control signal 11 is a disable signal (e.g., a disable signal having a low value or a high value).

As shown in FIG. 1, the switch circuit 120, which is included in the charge pump switch 100, is coupled to the signal generator 180 and to the signal receiver 190. The switch circuit 120 can be configured to change between an on-state (e.g., an active state, a conducting state) and an off-state (e.g., a deactivated state, a non-conducting state) when the charge pump switch 100 is enabled and disabled, respectively. Accordingly, the switch circuit 120 can be triggered to change to an on-state when the switch control signal 11 is an enable signal (e.g., an enable signal having a high value or a low value), and the switch circuit 120 can be triggered to change to an off-state when the switch control signal 11 is a disable signal (e.g., a disable signal having a high value or a low value).

In some embodiments, the switch circuit 120 can include, for example, one or more metal-oxide-semiconductor field-effect transistors (MOSFETs) (e.g., vertical MOSFET device(s), lateral MOSFET device(s), an array of MOSFET devices). In some embodiments, the switch circuit 120 can include one or more N-type MOSFET (NMOS) devices. In some embodiments, the switch circuit 120 can include one or more P-type MOSFET (PMOS) devices. In some embodiments, the switch circuit 120 can include one or more inverters, logic gates, and/or so forth. In some embodiments, the switch circuit 120 (and the charge pump switch 100) can function as (e.g., can be configured to function as), for example, a pass gate or as a blocking component. Moreover, the switch circuit 120 (and the charge pump switch 100) can function as a pass gate or as a blocking component between the signal generator 180 and the signal receiver 190. In some embodiments, the switch circuit 120 can be referred to as a complementary switch circuit when including complementary MOSFET devices (e.g., an NMOS device and a PMOS device).

When functioning as a pass gate, the switch circuit 120 can be configured to pass (or transmit) the data signal 12 between the signal generator 180 and the signal receiver 190. The switch circuit 120, when functioning as a pass gate that is on, or enabled, can provide a low impedance coupling between the sides of the pass gate. When functioning as a pass gate, the switch circuit 120 can be configured to block the data signal 12 from being transmitted between the signal generator 180 and the signal receiver 190. The switch circuit 120, when functioning as a pass gate that is off, or disabled, can provide a high impedance between the sides of the pass gate. In some embodiments, at least one side of a pass gate can be coupled to more than one signal line. In some embodiments, when the pass gate is disabled, leakage through the disabled pass gate can cause harmonic distortion of a signal coupled to the pass gate.

As shown in FIG. 1, the charge pump switch 100 includes a voltage control circuit 110. The voltage control circuit 110 is configured to manage voltages applied (e.g., provided) to the switch circuit 120 via a driver circuit 112 during operation of the charge pump switch 100. In addition to applying a voltage to the switch circuit 120 via the driver circuit 112 to turn off the switch circuit in response to the switch control signal 11 (e.g., the switch control signal 11 having a disable value), the voltage control circuit 110 can be configured to apply voltages to the switch circuit 120 via the driver circuit 112 when the switch circuit 120 is turned on. Specifically, the voltage control circuit 110 can be configured to apply different voltage to the switch circuit 120 depending on a charge pump control signal 10.

The voltage control circuit 110 can be configured to manage voltages applied to the switch circuit 120 so that the switch circuit 120 is maintained in a desirable state (e.g., a desirable on-state, a desirable off-state). For example, the voltage control circuit 110 can be configured to apply the highest available voltage to the switch circuit 120 (or a portion thereof) when the charge pump switch 100 is enabled so that the switch circuit 120 has a relatively low on-resistance and/or on-capacitance when turned on. Because the on-resistance and/or on-capacitance of the switch circuit 120 can be relatively low (when the switch circuit 120 is activated or in an on-state), the integrity of one or more signals passing through the switch circuit 120 can be maintained. In some embodiments, a signal passing through the switch circuit 120 can have a frequency that is higher than would be possible if the highest available voltage were not applied to the switch circuit 120 (or a portion thereof) when the charge pump switch 100 is enabled. Also, a signal passing through the switch circuit 120 can have a bandwidth that is higher than would be possible if the charge pump switch 100 if the highest available voltage were not applied to the switch circuit 120 (or a portion thereof) when the charge pump switch 100 is enabled. The voltage control circuit 110 can be configured to apply the highest available voltage to the driver circuit 112 (e.g., a battery voltage) when the charge pump switch 100 is disabled so that the driver circuit 112 can continue to operate and maintain the switch circuit 120 in an off-state.

In this embodiment, the voltage control circuit 110 can be configured to apply a charge pump voltage VP produced by a charge pump device 140 (as illustrated by path 19) when the charge pump switch 100 is enabled in response to the switch control signal 11 and when the charge pump device 140 is enabled as indicated by the charge pump control signal 10. When the charge pump device 140 is disabled, as indicated by the charge pump control signal 10 (while the charge pump switch 100 is enabled or disabled in response to the switch control signal 11), the voltage control circuit 110 can be configured to instead apply a voltage produced by a voltage selector 113 (as illustrated by path 18) to the driver circuit 112. Accordingly, different voltages (associated with different electrical paths) can be applied to the driver circuit 112 (and to the switch circuit 120) when the charge pump switch 100 is enabled depending on the state of the charge pump device 140. Said differently, different voltages can be applied to the driver circuit 112 and the switch circuit 120 to maintain the switch circuit 120 (or a portion thereof) in a desirable state depending on the state of the charge pump device 140 as indicated by the charge pump control signal 10.

In some embodiments, the charge pump device 140 can be controlled using (e.g., controlled in response to) the charge pump control signal 10. In some embodiments, the charge pump device 140 can be disabled to conserve energy within a system including the charge pump switch 100. In some embodiments, the charge pump device 140 can be produced based on a battery voltage of a system including the charge pump switch 100.

As shown in FIG. 1, the voltage associated with path 18 to the driver circuit 112 (and the switch circuit 120) is provided by a voltage selector 113. The voltage selector 113 can be configured to select one of several voltages V1 through VN via path 18 to the driver circuit 112. Specifically, in some embodiments, the voltage selector 113 can be configured to select the highest of voltages V1 through VN via path 18 to the driver circuit 112. In some embodiments, the voltage selector 113 can be referred to as an overvoltage (OVT) device or circuit or as an overvoltage network.

For example, when the charge pump switch 100 is enabled, charge pump voltage VP from the charge pump device 140 can be applied to the switch circuit 120 via the driver circuit 112 to maintain the switch circuit 120 (or a portion thereof) in an on-state when the charge pump device 140 is enabled as indicated by the charge pump control signal 10. When the charge pump device 140 is disabled as indicated by the charge pump control signal 10, one of voltages V1 through VN can be selected (e.g., the highest of voltages V1 through VN can be selected) by the voltage selector 113. The voltage selected by the voltage selector 113 can be supplied via path 18 to operate the driver circuit 112 driving the switch circuit 120 to maintain the switch circuit 120 (or a portion thereof) in an off-state or an on-state.

In some embodiments, the charge pump device 140 can be a positive charge pump device. Accordingly, the charge pump voltage VP can be a positive charge pump voltage. In some embodiments, the charge pump voltage VP can be higher than one or more of the voltages V1 through VN. In some embodiments, the charge pump voltage VP can be higher than all of the voltages V1 through VN. In some embodiments, the voltages V1 through VN can include (or can be) a voltage associated with the data signal 12 (e.g., an input portion of the data signal 12, an output portion of the data signal 12), a battery voltage, a regulation voltage, and/or so forth.

If the charge pump voltage VP has a voltage level that is higher than any of the voltages V1 through VN provided (e.g., produced) by the voltage selector 113, the voltage control circuit 110 can be configured to apply the charge pump voltage VP to the switch circuit 120 when the charge pump device 140 is enabled (as indicated by the charge pump control signal 10). When the charge pump device 140 is disabled, the voltage control circuit 110 can be configured to provide the highest of voltages V1 through VN from the voltage selector 113. Accordingly, voltage control circuit 110 can be configured to apply the highest available voltage to driver circuit 112 to drive the switch circuit 120 when the charge pump switch 100 is enabled or disabled so that the switch circuit 120 (or portion thereof) has a relatively low on-resistance and/or on-capacitance, or blocks the data signal 12 with a desirable level of leakage.

Although not shown in FIG. 1, in some embodiments, the switch circuit 120 (or a portion thereof) can similarly be maintained in an off-state by one or more voltages (e.g., a ground voltage) via the driver circuit 112 of the voltage control circuit 110. In other words, the voltage control circuit 110 can be configured to provide one or more voltages, such as a ground voltage, or a negative charge pump voltage, via one or more paths to the switch circuit 120 to maintain the switch circuit 120 in an off-state. Specifically, the voltage control circuit 110 can be configured to provide one or more voltages to the switch circuit 120 to maintain the switch circuit 120 in an off-state based on a state of another component (e.g., such as the charge pump device 140).

In some embodiments, the paths 18, 19 can be configured with components (e.g., combinational logic, devices) so that a voltage drop across the paths 18, 19 will be relatively low or zero. For example, the path 18 can be configured so that a voltage drop along the path will be relatively small (e.g., zero, approximately zero, negligible) when path 18 is being used to apply a voltage to maintain the switch circuit 120 via the driver circuit 112 in an on-state or an off-state. As another example, the path 19 can be configured so that a voltage drop along the path 19 will be relatively small (e.g., zero, approximately zero, negligible) when path 19 is being used to apply a voltage to maintain the switch circuit 120 via the driver circuit 112 in an on-state or an off-state.

In addition, the paths 18, 19 can be configured with components so that leakage (e.g., current leakage) along the paths 18, 19 may be relatively small (e.g., minimized) when a particular one of the paths 18, 19 is not being used. For example, if the charge pump voltage VP is being applied along path 19 to the switch circuit 120, path 18 can be configured so that leakage along path 18 may be relatively small (e.g., may be minimized). Similarly, if a voltage from the voltage selector 113 is being applied along path 18 to the driver circuit 112 (en-route to the switch circuit 120), path 19 can be configured so that leakage along path 19 may be relatively small (e.g., may be minimized).

Also, although not explicitly shown in FIG. 1, the switch circuit 120 can include an N-type MOSFET device that is maintained in an on-state by the voltage control circuit 110 using one or more voltages depending on the state of the charge pump device 140. In some embodiments, the switch circuit 120 can include a P-type MOSFET device that is maintained in an on-state by the voltage control circuit 110 (or another voltage control circuit) using one or more voltages depending on the state of a components such as a negative charge pump device.

In some embodiments, the charge pump switch 100 shown in FIG. 1 can be used in a variety of applications including data connectivity applications. In some embodiments, the charge pump switch 100 can be included in one or more terminals (e.g., data ports, data connectors) configured to receive the data signal 12, one or more terminals configured to transmit the data signal 12 to another computing device. In some embodiments, the signal generator 180 and/or the signal receiver 190 can be included in, or can function as, a data source such as a mobile phone, a computing device, a hard drive, a network device a universal serial bus (USB) connected computing device, an audio/video device (e.g., music storage device, web camera, video recorder), and/or so forth, configured to produce and/or receive the data signal 12.

In some embodiments, the data signal 12 can be, for example, a video signal, an audio signal, a control signal, and/or so forth. In some embodiments, the data signal 12 can be a differential signal, a high-frequency signal, a low-frequency signal, a multiplexed signal, an analog signal, a digital signal, and/or so forth. In some embodiments, the data signal 12 can be based on one or more protocols, codecs, and/or so forth. In some embodiments, the data signal 12 can be, for example, a USB signal (e.g., a USB 2.0 signal, a USB 3.0 signal), an audio signal, a video signal, a universal asynchronous receiver/transmitter (UART) signal, an mobile HD link (MHL) signal, and/or so forth.

In some embodiments, the charge pump switch 100, the signal generator 180, and/or the signal receiver 190 can be included in a variety of computing devices such as a wired device and/or a wireless device (e.g., wi-fi enabled device) and can be, for example, a computing entity (e.g., a personal computing device), a server device (e.g., a web server), a mobile phone, a touchscreen device, a personal digital assistant (PDA), a laptop, a television including, or associated with, one or more processors, a tablet device, e-reader, and/or so forth. The computing device(s) can be configured to operate based on one or more platforms (e.g., one or more similar or different platforms) that can include one or more types of hardware, software, firmware, operating systems, runtime libraries, and/or so forth.

In some embodiments, the charge pump switch 100 can be configured to function as a transmission gate switch for, for example, one or more computing devices. In some embodiments, the charge pump switch 100 can be, for example, included in a mobile switch link, high definition link, and/or so forth. In some embodiments, the charge pump switch 100 can be included in one or more data conductivity applications, data communication applications, load switch applications, and/or so forth.

Figure 2:
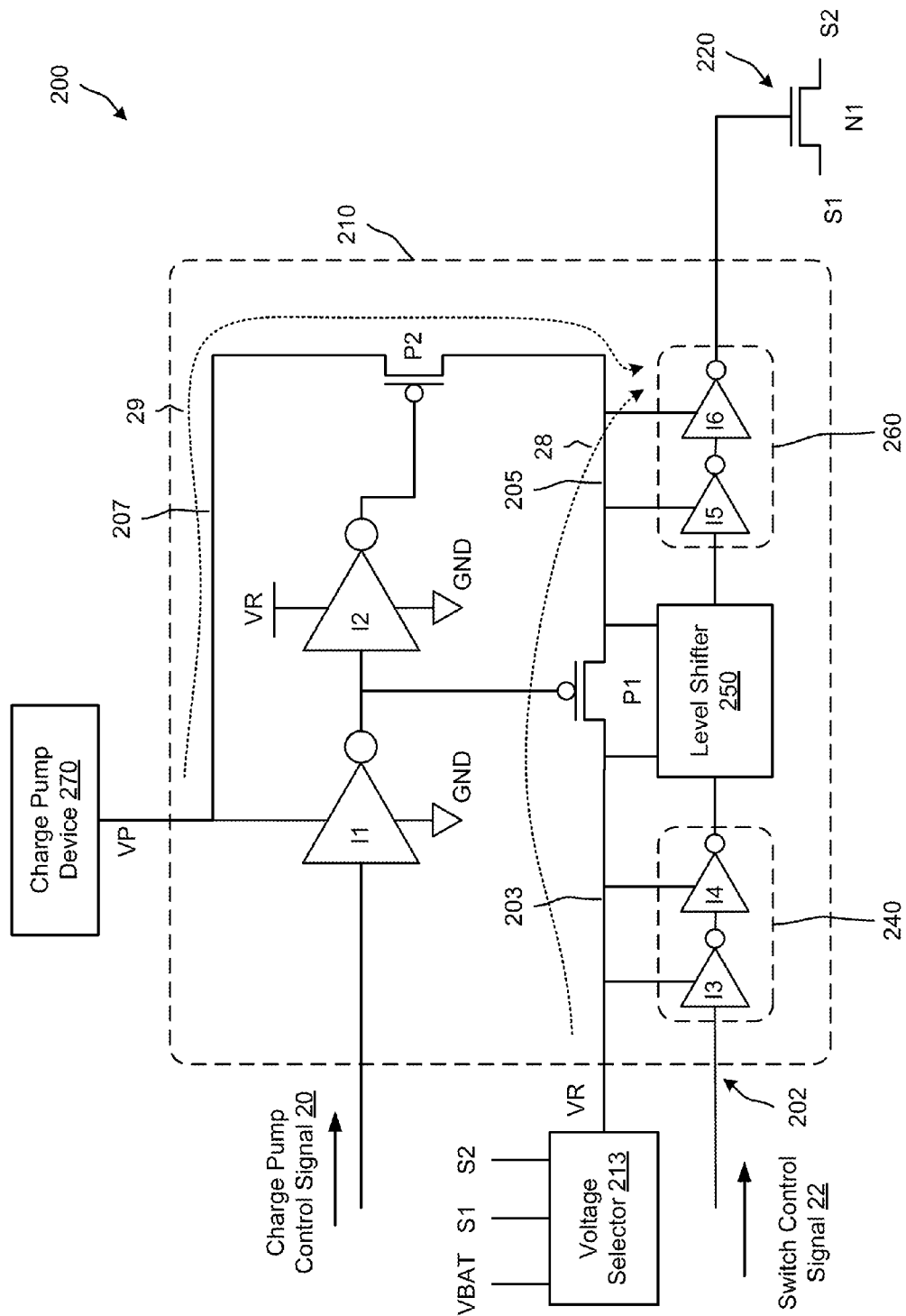
FIG. 2 is a schematic diagram that illustrates an implementation of a charge pump switch, according to an embodiment.

FIG. 2 is a schematic diagram that illustrates an implementation of a charge pump switch 200, according to an embodiment. In some embodiments, the charge pump switch 200 can be an implementation of the charge pump switch 100 shown in FIG. 1.

As shown in FIG. 2, the charge pump switch 200 has a voltage control circuit 210. In this embodiment, the voltage control circuit 210 is configured to provide a charge pump voltage VP from a charge pump device 270 via path 29 when the charge pump device 270 is enabled. The voltage control circuit 210 is configured to provide a rail voltage VR from the voltage selector 213 via path 28 when the charge pump device 270 is disabled. As shown in FIG. 2, the path 28 includes a first voltage rail 203 and a second voltage rail 205. The path 29 includes a third voltage rail 207 and at least a portion of the second voltage rail 205. In some embodiments, the designation of the voltage rails as a first, second, or third voltage rail can be different. For example, the first voltage rail 203 can be referred to as a second voltage rail and the second voltage rail 205 can be referred to as a first voltage rail, and so forth. In some embodiments, the voltage rails can be referred to as nodes or as voltage nodes.

In this embodiment, the switch circuit 220 is illustrated as a single N-type MOSFET (NMOS) device N1, but the switch circuit 220 can be referred to as a circuit because the switch circuit 220 can include multiple devices. The switch circuit 220 can function as a pass gate (e.g., a pass-through gate). An input signal (e.g., input data signal) S1 can be received on one side of the switch circuit 220 and can be transmitted from the switch circuit 220 as output signal S2 (when the switch circuit 220 is turned on). When the switch circuit 220 is off, the input signal S1 can be blocked or prevented (e.g., substantially blocked or prevented) from passing through the switch circuit 220.

As shown in FIG. 2, the charge pump device 270, which produces charge pump voltage VP, is coupled to an inverter I1 (as a supply voltage), and the rail voltage VR is coupled to an inverter I2 (as a supply voltage). Both inverter I1 and inverter I2 are coupled to a ground voltage GND. The inverter I1 has a state that is controlled by a charge pump control signal 20 (which indicates the state of the charge pump device 270). In this embodiment, when the charge pump device 270 is enabled, the charge pump control signal 20 has a low value (e.g., low enable), and when the charge pump device 270 is disabled, the charge pump control signal 20 has a high value (e.g., high disable). In some embodiments, one or more of the devices shown in FIG. 2 can be coupled to an under-voltage network rather than the ground voltage GND.

As shown in FIG. 2, the voltage selector 213 is configured to provide the rail voltage VR based on a battery voltage VBAT (which can be provided by a battery), a voltage of the input signal S1, and/or a voltage of the input signal S2. In some embodiments, the voltage selector 213 can be configured to provide rail voltage VR based on different voltages than those shown. The battery voltage VBAT, a voltage of the input signal S1, and a voltage of the input signal S2 can be collectively referred to as a set of voltages. In some embodiments, the voltage selector 213 can be configured to select a voltage to apply to rail voltage VR from a different set of voltages (e.g., more voltages, less voltages) than shown in FIG. 2.

In this embodiment, a second driver circuit 260 provides a logic state (e.g., an output value) that matches the value of the switch control signal 22. A first driver circuit 240, a level shifter 250, and the second driver circuit 260 function as combinational logic between the switch control signal 22 and the switch circuit 220 so that a logic state of the second driver circuit 260 matches the logic state of the switch control signal 22. In some embodiments, the level shifter 250 can be referred to as an up translator. In some embodiments, the designation of the driver circuits as a first and second can be different. For example, the first driver circuit 240 can be referred to as a second driver circuit and the second driver circuit 250 can be referred to as a first driver circuit, and so forth.

As shown in FIG. 2, the first driver circuit 240 includes inverters I3 and I4, and the second driver circuit 260 includes inverters I5 and I6. A voltage of the first voltage rail 203 (i.e., the rail voltage VR) can function as a supply voltage of the inverters I3 and I4 and a voltage on the second voltage rail 205 (i.e., the charge pump voltage VP or the rail voltage VR) can function as a supply voltage of the inverters I5 and I6. Although not explicitly shown in FIG. 2, the inverters I1 through I6 can also be coupled to the ground voltage GND. In some embodiments, one or more of the inverters I1 through I6 can be coupled to an under-voltage network rather than the ground voltage GND.

The charge pump switch 200 is configured to receive a switch control signal 22 at an input terminal 202 of the charge pump switch 200. In this embodiment, the charge pump switch 200 is configured so that the switch circuit 220 is changed to an on-state in response to the switch control signal 22 being an enable signal (as a high enable). When the switch control signal 22 has a high value, the second driver circuit 260 provides a high logic state (e.g., high value output) that is equal to (e.g., substantially equal to) the charge pump voltage VP produced by the positive charge pump device 270 (via path 29) or at the rail voltage VR provided by the voltage selector 213 (via path 28). The high logic state from the second driver circuit 260 can turn on (e.g., activate) the NMOS device N1. Also, when the switch control signal 22 has a low logic state, the second driver circuit 260 produces a low logic state (e.g., low value output). The low logic state can turn on (e.g., activate) the PMOS device P1. In some embodiments, the low logic state can be, for example, a ground voltage such as ground voltage GND.

The separate paths 28 and 29 are controlled by P-type MOSFET (PMOS) devices. Specifically, the paths 28 and 29 are controlled by PMOS device P1 and PMOS device P2. As shown in FIG. 2, the PMOS devices P1, P2 are controlled in response to charge pump control signal 20.

As a specific example, when the charge pump control signal 20 is a low logic state (a low enable signal indicating that the charge pump device 270 is enabled) the inverter I1 applies a high logic state at the charge pump voltage VP to the PMOS device P1 and to the inverter I2. The high logic state at the charge pump voltage VP to the PMOS device P1 turns off (e.g., deactivates) the PMOS device P1, isolating the voltage selector 213 from the switch circuit 220. Moreover, the first voltage rail 203 is isolated from the second voltage rail 205 by the PMOS device P1 so that the rail voltage VR provided by the voltage selector 213 may not be applied to the switch circuit 220.

Also, in response to the high logic state being applied to the inverter I2 from the inverter I1, the inverter I2 applies the ground voltage GND to the PMOS device P2 turning on (e.g., activating) the PMOS device P2 so that the charge pump voltage VP produced by the charge pump device 270 is applied via path 29 to the switch circuit 220 via the driver circuit 260. Accordingly, when the charge pump device 270 is enabled, the charge pump voltage VP is applied to the switch circuit 220 can maintain the NMOS device N1 in an on-state (via the second driver circuit 260). Also, the second driver circuit 260 (e.g., inverters I5 and I6) operates based on the charge pump voltage VP from the charge pump device 270, and the first driver circuit 240 (e.g., inverters I3 and I4) operates based on the rail voltage VR from the voltage selector 213.

In contrast, when the charge pump control signal 20 is a high logic state (a high enable signal indicating that the charge pump device 270 is disabled) the inverter I1 applies a low logic state at the ground voltage GND to the PMOS device P1 and to the inverter I2. The low logic state at the ground voltage GND to the PMOS device P1 turns on (e.g., activates) the PMOS device P1 electrically coupling the voltage selector 213 to the switch circuit 220 via path 28 including first voltage rail 203 and the second voltage rail 205. Accordingly, when the charge pump device 270 is disabled, the voltage selector 213 can provide the rail voltage VR (which can be selected from the battery voltage VBAT, the input signal voltage S1, or the output signal voltage S2) so that both the first driver circuit 240 and the second driver circuit 260 operate based on the rail voltage VR from the voltage selector 213. In response to the low logic state being applied to the inverter I2 from the inverter I1, the inverter I2 applies the rail voltage VR (which can be selected from the battery voltage VBAT, the signal voltage S1, or the signal voltage S2) to the PMOS device P2 turning off (e.g., deactivating) the PMOS device P2 so that the third voltage rail 207 is isolated from the second voltage rail. Moreover, the third voltage rail 207 is isolated from the second voltage rail 205 by the PMOS device P2.

In such embodiments, the switch control signal 22, via the first driver circuit 240, the level shifter 250, and the second driver circuit 260, can control the NMOS device N1 included in the switch circuit 220. In other words, the first driver circuit 240, the level shifter 250, and the 2nd driver circuit 260 can operate based on the rail voltage VR provided by the voltage selector 213 so that the switch circuit 220 can be turned on (e.g., activated) or turned off (e.g., deactivated) in response to the switch control signal 22 even though the charge pump device 270 is not active or enabled. If not operating based on the rail voltage VR, the driver circuits 240, 260 and level shifter 250 may not properly operate the switch control signal 22 in response to the switch control signal 22 when the charge pump device 270 is not active or enabled.

In the scenario where the charge pump control signal 20 indicates that the charge pump device 270 is enabled, the gate-to-source voltage (Vgs) across the PMOS device P1 will be approximately zero. In other words, the gate voltage of the PMOS device P1 can be approximately the same as the source voltage of the PMOS device P1. Specifically, the voltage applied to the gate of the PMOS device P1 will be the charge pump voltage VP produced by the charge pump device 270. Also the voltage applied to the second voltage rail 205 will be the charge pump voltage VP produced by the charge pump device 270. Accordingly, the gate-to-source voltage (Vgs) across the PMOS device P1 will be approximately zero and the PMOS device P1 can be completely off. In such embodiments, leakage through the PMOS device P1 can be avoided or substantially avoided. Specifically, in such embodiments where the charge pump voltage VP is applied to both gate and the source of the PMOS device P1, the leakage through the PMOS device P1 may be smaller than compared to a scenario where a voltage (e.g., a battery voltage VBAT) lower than the charge pump voltage VP were applied to the gate of the PMOS device P1 and the charge pump voltage VP were applied to the source of the PMOS device P1.

In the scenario where the charge pump control signal 20 indicates that the charge pump device 270 is disabled, the voltage of the first voltage rail 203 can be equal to (or substantially the same as) the voltage of the second voltage rail 205. In other words, the voltage drop between the first voltage rail 203 and the second voltage rail 205 can be approximately zero. Because the PMOS device P1 does not have, for example, a threshold voltage drop (which can be associated with an N-type MOSFET device or a Schottky diode device), the voltage of the first voltage rail 203 can be equal to (or substantially the same as) the voltage of the second voltage rail 205 when the PMOS device P1 is activated in response to the charge pump control signal 20 indicating that the charge pump device 270 is disabled. In such embodiments, the voltage of the second voltage rail 205 can be substantially equal to the rail voltage VR provided by the voltage selector 213.

In this embodiment, the rail voltage VR is coupled as a supply voltage to the inverter I2. Because the rail voltage VR is the supply voltage, even if the charge pump device 270 is not active (e.g., is disabled), the second inventor I2 can provide a logical high value to the PMOS device P2 to turn off the PMOS device P2. If the charge pump device 270 were coupled to the inverter I2 as a supply, the inverter I2 may not provide a logical high value when the charge pump device 270 is disabled. In some embodiments, a voltage different than the rail voltage VR, such as a regulation voltage or another voltage that is reliably turned-on, can be coupled to the inverter I2.

As shown in FIG. 1, the charge pump switch 200 includes a single voltage selector. In some embodiments, a second voltage selector can be included in the charge pump switch 200. For example, a second voltage selector can be coupled to the third voltage rail 207. In such embodiments, the second voltage selector can be configured to provide (e.g., apply) a voltage from a set of voltages to the third voltage rail 207. The charge pump voltage VP can be included in the set of voltages.

In some embodiments, the driver circuits 240, 260 can include components such as bipolar junction transistor (BJT) devices, MOSFET devices, diodes, capacitors, and/or so forth, in addition to, or in place of, one or more of the inverters I3 through I6. In some embodiments, one or more of the driver circuits 240, 260 can include various types of combinational logic (e.g., inverters, logic gates (e.g., NAND gates, NOR gates, AND gates, OR gates, etc.)). As a specific example, the first driver circuit 240 and/or the second driver circuit 260 can include more or less than two serially connected inverters.

Also, in some embodiments, the inverter I1 and/or the inverter I2 can include, or can be replaced with, a variety of combinational logic (e.g., inverters, logic gates (e.g., NAND gates, NOR gates, AND gates, OR gates, etc.)). For example, the inverter I1 can be replaced with combinational logic devices (which can be referred to as a first combinational logic portion) and/or the inverter I2 can be replaced with combinational logic devices (which can be referred to as a second combinational logic portion). As a specific example, the inverter I1 can include, or can be replaced with, combinational logic so that the PMOS devices P1 is changed to an off-state in response to the charge pump control signal 20 being an enable signal with a high value rather than an enable signal with a low value. The inverter I2 can similarly be modified to change to an on-state in response to the charge pump control signal 20 being an enable signal with a high value rather than an enable signal with a low value.

In some embodiments, the inverter I2 can be replaced with, or can include, for example, a Schmitt Trigger. In such embodiments, the Schmitt Trigger can, for example, reduce the possibility of ringing that can occur within the inverter I2 (and can be manifested in an output of the inverter I2) in response to a relatively slow ramp rate of the charge pump device 270 when the charge pump device 270 is enabled. In some embodiments, the absence of ringing can be the result of hysteresis characteristics associated with the inverter I2 when the inverter I2 is (or includes) a Schmitt Trigger.

Although not shown in FIG. 2, in some embodiments, the switch circuit 220 can include a P-type MOSFET device, in addition to NMOS device N1. In such embodiments, the switch circuit 220 can be a complementary switch circuit, and the P-type MOSFET device can be controlled by logic included in the voltage control circuit 210. In such embodiments, the charge pump switch 200 can include multiple charge pump devices that can be used to drive different portions of the switch circuit 220. For example, the charge pump device 270 can be a positive charge pump device configured to provide (e.g., produce) a positive charge pump voltage. The charge pump switch 200 can include a negative charge pump device (not shown) configured to provide a negative charge pump voltage for a P-type MOSFET device (not shown). In some embodiments, because the charge pump switch 200 includes multiple charge pump devices, the charge pump switch 200 can be referred to as a multi-charge pump switch.

In some embodiments, the level shifter 250 can be configured to provide a desirable logical state (e.g., voltage level) to the second driver circuit 260 based on the logical state of the first driver circuit 240. In some embodiments, the level shifter 250 can be configured to provide isolation (e.g., voltage isolation) between the first voltage rail 203 and the second voltage rail 205 when the PMOS device P1 is off.

FIGS. 3A through 3I are graphs that illustrate operation of a charge pump switch including a switch circuit. The charge pump switch can be similar to the charge pump switch 100 shown in FIG. 1 and/or the charge pump switch 200 shown in FIG. 2. In these graphs, time is increasing to the right.

Figure 3A:
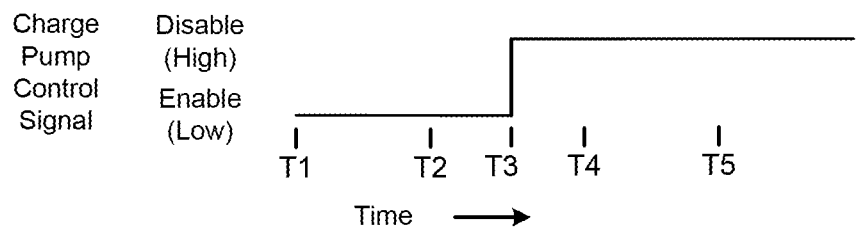
FIGS. 3A through 3I are graphs that illustrate operation of a charge pump switch including a switch circuit.

As shown in FIG. 3A, the charge pump control signal (e.g., the charge pump control signal 20 shown in FIG. 2) is configured to be an enable signal (which has a low value) between approximately time T1 and time T3. The charge pump control signal is changed from the enable signal to a disable signal (which has a high value) at approximately time T3. In some embodiments, the charge pump control signal can be an indicator of a state of a charge pump device (referred to as charge pump device DVP) (e.g., the charge pump device 270 shown in FIG. 2) as enabled or disabled. In some embodiments, the charge pump control signal can have a high value when enabled, and the charge pump control signal can have a low value when enabled.

Figure 3B:
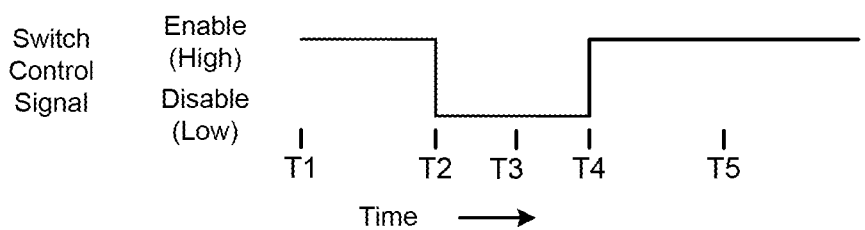

As shown in FIG. 3B, the switch control signal (e.g., the switch control signal 22 shown in FIG. 2) is configured to be an enable signal (which has a high value) between approximately time T1 and time T2, and after approximately time T4. The switch control signal is changed from the enable signal to a disable signal (which has a low value) at approximately time T2 until approximately time T4. In this embodiment, the charge pump control signal changes from being enabled to disabled (shown in FIG. 3A) at approximately time T3, which is before the switch control signal changes from being disabled to enabled at approximately time T4 (shown in FIG. 3B). In some embodiments, the switch control signal can have a low value when enabled, and the switch control signal can have a high value when enabled.

Figure 3C:
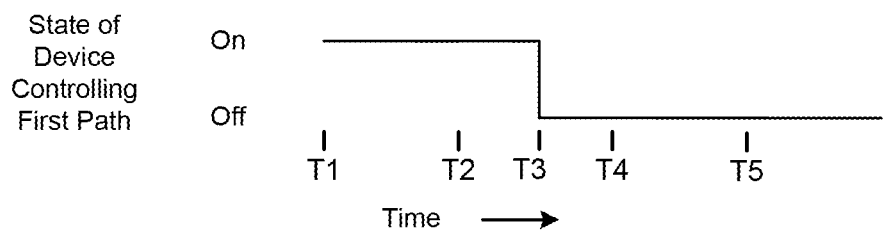
Figure 3D:
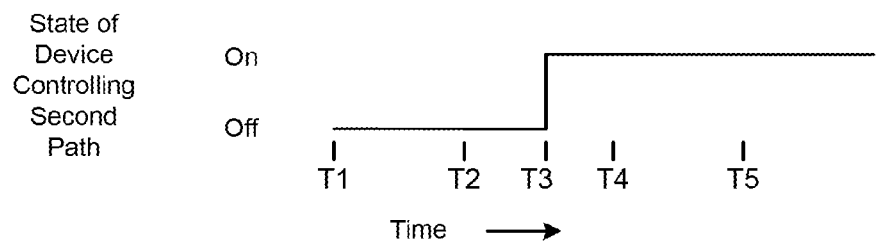
Figure 3E:
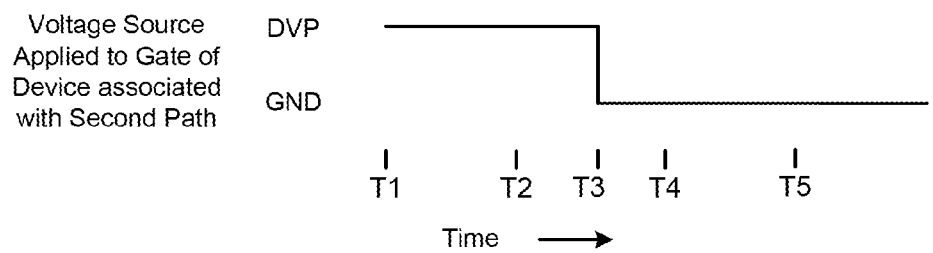
Figure 3F:
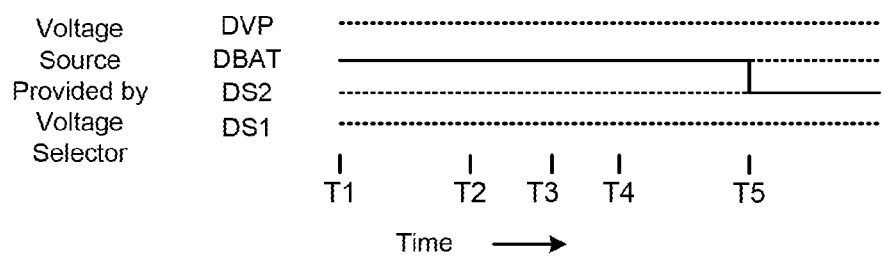
Figure 3G:
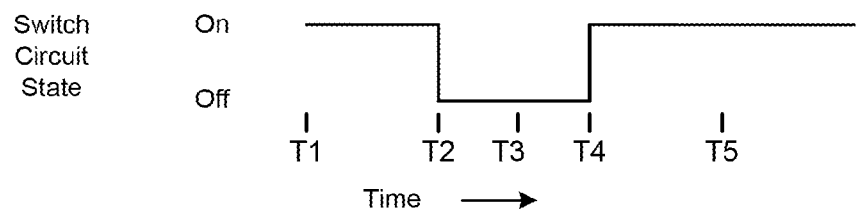

In response to the enable signal (of the switch control signal) between approximately times T1 and T2 and after approximately time T4, the switch circuit state (e.g., the state of the switch circuit 220 shown in FIG. 2), as shown in FIG. 3G, is in an on-state (e.g., activated). As shown in FIG. 3G, in response to the disable signal between approximately times T2 and T4, the switch circuit state is in an off-state (e.g., deactivated).

FIGS. 3C and 3D are graphs that illustrate the states of devices controlling a first path and a second path, respectively. The first path can be coupled between, for example, a charge pump device DVP configured to produce a charge pump voltage and to a gate of the switch circuit via one or more driver circuits. The second path can be coupled between, for example, a voltage selector (e.g., the voltage selector 213 shown in FIG. 2) and the gate of the switch circuit via one or more driver circuits. The second path can be controlled by a device having a gate voltage from either the charge pump device DVP or a ground voltage GND (e.g., a ground voltage node GND) (shown in FIG. 3E).

As shown in FIG. 3F, a voltage source provided by the voltage selector can be selected from a set of voltage sources (e.g., a set of voltages) including a battery voltage source DBAT, a signal voltage source DS2, and a signal voltage source DS1. The voltage source selected by the voltage selector is the battery voltage source DBAT until approximately time T5. At approximately time T5, the rail voltage VR changes from being supplied by the battery voltage source DBAT to the signal voltage source DS2. In some embodiments, the voltage provided by the voltage selector can be referred to as a rail voltage. In some embodiments, the voltage selector can be configured to select a voltage source from a set of voltage sources different from those shown in FIG. 3F.

Figure 3H:
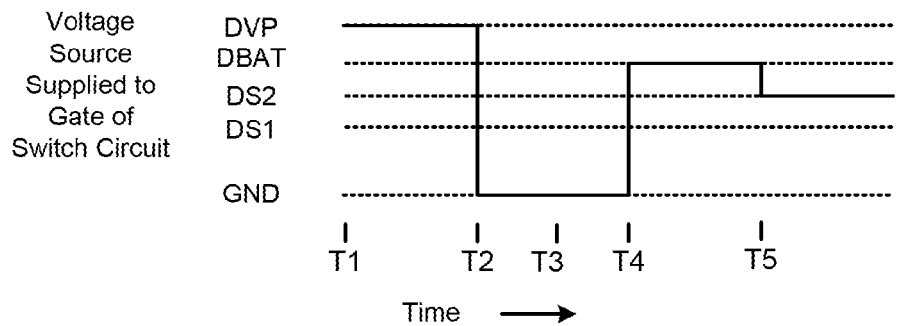

When the charge pump control signal is enabled between approximately times T1 and T3 (shown in FIG. 3A), a state of a device controlling the first path (e.g., the PMOS device P2 controlling path 29 shown in FIG. 2) is on (or activated) as shown in FIG. 3C, and a state of a device controlling a second path (e.g., the PMOS device P1 controlling path 28 shown in FIG. 2) is off (or deactivated) as shown in FIG. 3D. When the device controlling the first path is activated and when the switch control signal is enabled (shown in FIG. 3B), the charge pump voltage VP produced by the charge pump device coupled to the first path is applied to the switch circuit as shown in FIG. 3H. When the device controlling the first path is activated and when the switch control signal is disabled, the charge pump voltage from the charge pump device DVP is not applied to the switch circuit. Instead, the ground voltage GND (e.g., a ground voltage node) is applied to the switch circuit as shown in FIG. 3H.

When the charge pump control signal is disabled after approximately time T3 (as shown in FIG. 3A), the state of the device controlling the first path is off (or deactivated) as shown in FIG. 3C, and the state of the device controlling the second path is on (or activated) as shown in FIG. 3D. When the device controlling the second path is activated and when the switch control signal is enabled (shown in FIG. 3B), the voltage provided by the voltage selector, which is at the battery voltage provided by the battery voltage source DBAT, is applied to the switch circuit as shown in FIG. 3H. Because the voltage source applied by the voltage selector changes from the battery voltage source DBAT to the signal voltage source DS2 at approximately time T5 (as shown in FIG. 3F), the gate voltage of the switch circuit (via the second path) also drops from the battery voltage from the battery voltage source DBAT to the signal voltage from the signal voltage source DS2 at approximately time T5.

Although not shown, when the device controlling the second path is activated and when the switch control signal is disabled, the voltage provided by the voltage selector is not applied to the switch circuit. Instead, a ground voltage GND is applied to the switch circuit as shown in FIG. 3H. As illustrated by FIGS. 3C and 3D, the device controlling the first path and the device controlling the second path are activated during mutually exclusive time periods, and are deactivated during mutually exclusive time periods.

Figure 3I:
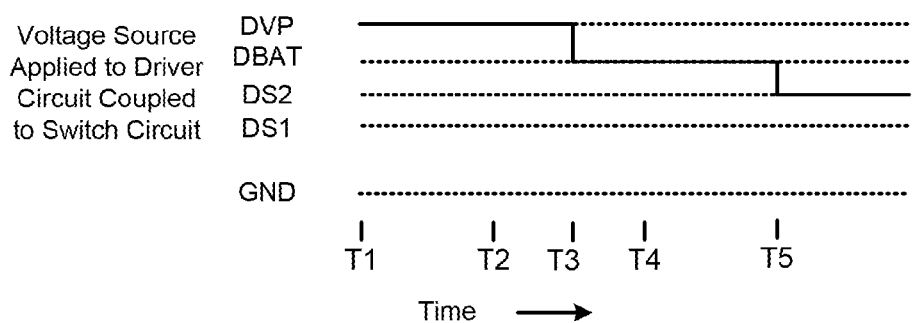

As shown in FIG. 3I, a voltage source applied to a driver circuit coupled to the switch circuit (e.g., the second driver circuit 260 shown in FIG. 2) changes multiple times. Specifically, the voltage source applied to the driver circuit is the charge pump voltage from the charge pump device DVP between approximately times T1 and T3 because the charge pump device DVP is enabled as indicated by the charge pump control signal shown in FIG. 3A. The state of the device controlling the first path (shown in FIG. 3C) between the charge pump device DVP and the driver circuit results in the charge pump voltage from the charge pump device DVP being supplied to the driver circuit.

As shown in FIG. 3I, the voltage supplied to the driver circuit changes from the battery voltage source DBAT between approximately times T3 and T5 and to the signal voltage source DS2 (from the voltage selector shown in FIG. 3F) because the charge pump device DVP is disabled as indicated by the charge pump control signal shown in FIG. 3A. The state of the device controlling the second path (shown in FIG. 3D) between the voltage selector and the driver circuit results in the battery voltage source DBAT and the signal voltage source DS2 being supplied to the driver circuit.

In this embodiment, the charge pump device DVP is disabled at approximately time T3 after the switch control signal triggers the switch circuit (shown in FIG. 3A) to change to an off-state approximately time T2 (shown in FIG. 3G). Also, in this embodiment, the charge pump device DVP remains disabled at approximately time T4 even though the switch control signal (shown in FIG. 3B) triggers the switch circuit to change to an on-state approximately time T2 (shown in FIG. 3G). In some embodiments, the charge pump device DVP can be disabled at approximately the same time that the switch circuit is changed to an off-state. In some embodiments, the charge pump device DVP can be enabled at approximately the same time that the switch circuit is changed to an on-state. In such embodiments, the switch circuit may not be changed to an on-state by a voltage provided by the voltage selector.

In some embodiments, the voltages illustrated from the sources illustrated in FIGS. 3E, 3F, 3H, and 3I can vary, for example, between −10 V and +10 V. In some embodiments, one or more of the voltages can be greater than +10 V or less than −10 V. In some embodiments, the voltages illustrated in these figures can be based on the voltage ratings of the devices in the charge pump switch (e.g., the switch circuit), the voltages available within the computing device including the charge pump switch, the voltage of signals into the charge pump switch, and so forth.

For example, the charge pump voltage provided by the charge pump device DVP can be approximately 5 volts, a battery voltage provided by the battery voltage source DBAT can be approximately 3 V, the ground voltage can be approximately 0 V. In some embodiments, a regulation voltage of a system including a charge pump switch (such as charge pump switch 200 shown in FIG. 2) can have a voltage greater than the battery voltage (e.g., a voltage of 4.5 V), between the charge pump voltage and the battery voltage, or below the battery voltage. In some embodiments, the difference between the charge pump voltage and the battery voltage can be greater than, equal to, or less than the difference between the charge pump voltage and the ground voltage.

Figure 4:
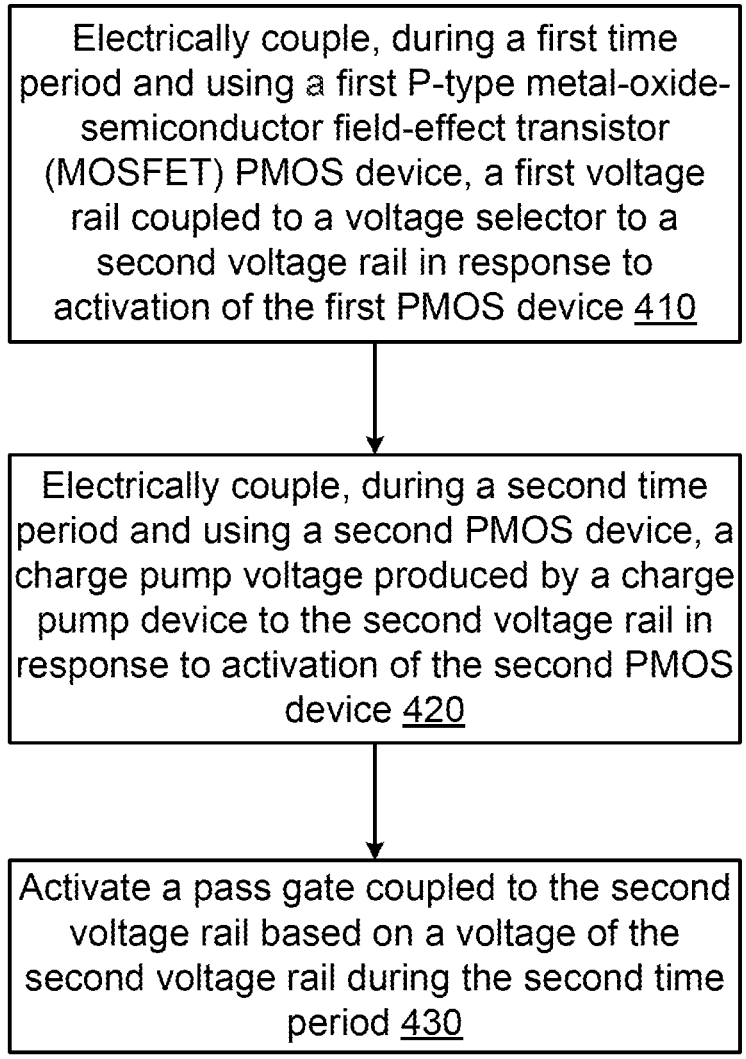
FIG. 4 is a flowchart that illustrates a method of operation of a charge pump switch, according to an embodiment.

FIG. 4 is a flowchart that illustrates a method of operation of a charge pump switch, according to an embodiment. In some embodiments, the charge pump switch can be, for example, charge pump switch 100 shown in FIG. 1, charge pump switch 200 shown in FIG. 2, and/so forth.

During a first time period and using a first P-type metal-oxide-semiconductor field-effect transistor (MOSFET) PMOS device, a first voltage rail coupled to a voltage selector is electrically coupled to a second voltage rail in response to activation of the first PMOS device (block 410). In some embodiments, the first PMOS device can be the PMOS device P1 shown in FIG. 2. In some embodiments, the first voltage rail can be the first voltage rail 203 and the second voltage rail can be the second voltage rail 205 shown in FIG. 2. In some embodiments, the second voltage rail 205 can be coupled to the NMOS device N1 shown in FIG. 2 (which can function as a pass gate) via a driver circuit (e.g., the second driver circuit 260 shown in FIG. 2), and the first voltage rail 203 can be coupled to the voltage selector 213 shown in FIG. 2.

During a second time period and using a second PMOS device, a charge pump voltage produced by a charge pump device is electrically coupled to the second voltage rail in response to activation of the second PMOS device (block 420). In some embodiments, the second PMOS device can be the PMOS device P2 shown in FIG. 2. In some embodiments, the charge pump voltage can be provided by the charge pump device 270 shown in FIG. 2. In some embodiments, the second voltage rail can be electrically coupled to a third voltage rail that is coupled to the charge pump device.

A pass gate coupled to the second voltage rail is activated based on a voltage of the second voltage rail during the second time period (block 430). In some embodiments, the pass gate can be maintained in an active state by the voltage of the second voltage rail during the second time period. In some embodiments, the pass gate can be maintained in the active state by the voltage of the second voltage rail during the first time period. In some embodiments, a driver circuit (e.g., the second driver circuit 260 shown in FIG. 2) can operate based on the voltage of the second voltage rail whether the second voltage rail is at the charge pump voltage or at a voltage provided by the voltage selector.

Figure 5:
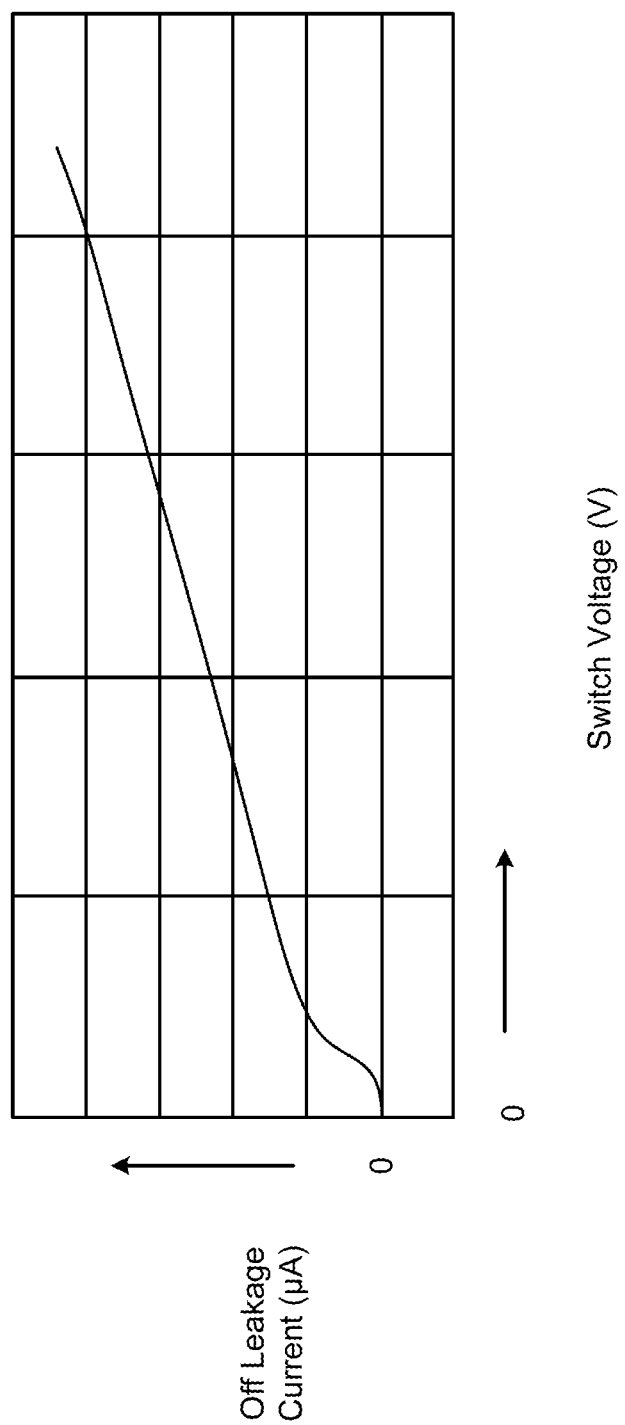
FIG. 5 is a graph that illustrates an off-leakage current associated with the charge pump switch shown in FIG. 2.

FIG. 5 is a graph that illustrates an off-leakage current of the charge pump switch 200 shown in FIG. 2. In other words, the graph illustrates the leakage current through the charge pump switch 200 when the charge pump switch 200 is off (or deactivated). The leakage can be through components such as the NMOS device N1, Schottky diodes included in the charge pump switch 200, and so forth. In this embodiment, the off-leakage current through the charge pump switch 200 is shown versus a switch voltage at the input terminal (or output terminal) of the charge pump switch 200 shown in FIG. 2. The off-leakage current through the charge pump switch 200 is approximately 0 to when the switch voltage is approximately 0 V, and the off-leakage current increases as the switch voltage increases. The off-leakage current shown in FIG. 5 can be the off-leakage current while the charge pump switch 200 is being maintained in an off-state using the driver circuit 260 operating based on the charge pump voltage VP or the rail voltage VR.

In some embodiments, the off-leakage current of the charge pump switch 200 can increase non-linearly as the switch voltage increases. In some embodiments, the off-leakage current of the charge pump switch 200 can increase between 0 to and 4 to as the switch voltage increases from 0 V to 4 V. In some embodiments, the off-leakage current of the charge pump switch 200 can depend on one or more characteristics of devices (e.g., size, oxide thickness, threshold voltage, metallization) of the charge pump switch 200.

Figure 6:
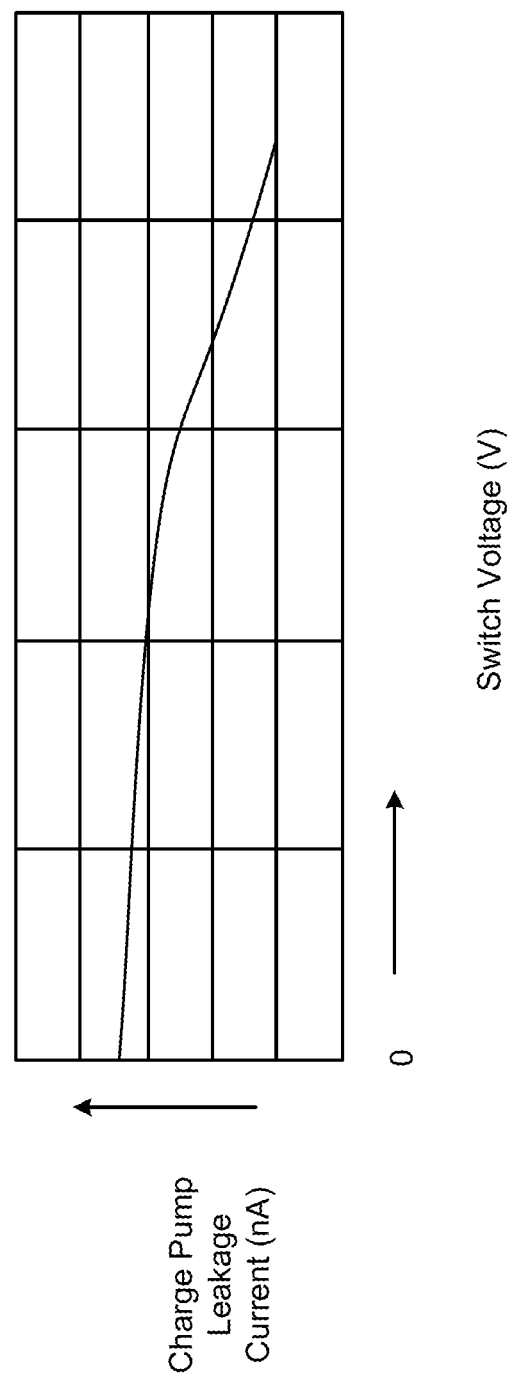
FIG. 6 is a graph that illustrates a charge pump leakage current associated with the charge pump switch shown in FIG. 2.

FIG. 6 is a graph that illustrates a charge pump leakage current within the charge pump switch 200 shown in FIG. 2. Specifically, the graph illustrates the leakage current of the charge pump device 270 shown in FIG. 2. In some embodiments, because the charge pump device 270 can be a high impedance device, charge storage within the charge pump device 270 and/or an output magnitude voltage (i.e., the charge pump voltage VP) of charge pump device 270 can be impacted in an undesirable fashion because of charge pump leakage current.

In this embodiment, the charge pump leakage current is shown versus switch voltage at the input terminal (or output terminal) of the NMOS device N1 shown in FIG. 2. As shown in FIG. 6, the charge pump leakage current decreases as the switch voltage increases. The PMOS device P1 can be configured to block leakage of current along path 28, which can contribute to the relatively small charge pump leakage current shown in FIG. 6.

In some embodiments, the charge pump leakage current can be between 0 nA and 20 nA (e.g., 5 nA, 10 nA, 12 nA, 15 nA). In some embodiments, the charge pump leakage current can be several orders of magnitude less than a charge pump leakage current that could occur if an NMOS device or a Schottky device were used in place of the PMOS device P1 in the charge pump switch 200.

In one general aspect, an apparatus including a first voltage rail, and a second voltage rail. The apparatus includes a first P-type metal-oxide-semiconductor field effect transistor (MOSFET) PMOS device between the first voltage rail and the second voltage rail where the first PMOS device is configured to electrically couple the first voltage rail to the second voltage rail in response to the first PMOS device being activated. The apparatus can also include a second PMOS device configured to provide a charge pump voltage produced by a charge pump device to the second voltage rail in response to the second PMOS device being activated and the first PMOS device being deactivated. The apparatus can also include a pass gate, and a driver circuit coupled to the pass gate and configured to operate based on a voltage of the second voltage rail.

In some embodiments, the apparatus can include a first combinational logic portion configured to trigger activation of the first PMOS device in response to a charge pump control signal indicating that the charge pump device is disabled. The apparatus can also include a second combinational logic portion configured to trigger deactivation of the second PMOS device in response to the charge pump control signal indicating that the charge pump device is disabled.

In some embodiments, the pass gate is configured to electrically couple a first node associated with a signal generator to a second node associated with a signal receiver when activated and configured to electrically isolate the first node from the second node when deactivated. In some embodiments, the first PMOS device and the second PMOS device are activated during mutually exclusive periods of time.

In some embodiments, the apparatus can include a voltage selector coupled to the first voltage rail and configured to select a highest voltage from a set of voltages where the charge pump voltage is higher than each voltage from the set of voltages. In some embodiments, the apparatus can include a voltage selector configured to select a highest voltage from a set of voltages where the voltage selector is configured to apply the highest voltage selected from the set of voltages to the second voltage rail via the first voltage rail in response to the first PMOS device being activated.

In some embodiments, the pass gate is maintained in an active state based on the voltage of the second voltage rail when the first PMOS device is activated and when the second PMOS is activated. In some embodiments, the driver circuit is a first driver circuit configured to activate the pass gate based on the voltage of the second voltage rail and configured to deactivate the pass gate based on a ground voltage. The apparatus can include a second driver circuit configured to receive a switch control signal configured to trigger activation and deactivation of the pass gate.

In some embodiments, the apparatus can include a level shifter having functionality triggered by the second driver circuit, and configured to trigger the first driver circuit. In some embodiments, the apparatus can include an inverter configured to provide, in response to a charge pump control signal having an enable value, a high value based on the charge pump voltage where the charge pump voltage provided by the inverter triggers the deactivation of the first PMOS device.

In another general aspect, a method can include electrically coupling, during a first time period and using a first PMOS device, a first voltage rail coupled to a voltage selector to a second voltage rail in response to activation of the first PMOS device. The method can include electrically coupling, during a second time period and using a second PMOS device, a charge pump voltage to the second voltage rail in response to activation of the second PMOS device. The method can also include activating a pass gate coupled to the second voltage rail based on a voltage of the second voltage rail during the second time period.

In some embodiments, the method can include receiving a charge pump control signal indicating a state of the charge pump device where the activation of the first PMOS device and the activation of the second PMOS device are triggered by the charge pump control signal. In some embodiments, the method can include operating a driver circuit based on the voltage of the second voltage rail during the first time period and during the second time period.

In some embodiments, the method can include selecting a highest voltage from a set of voltages using the voltage selector, and applying the highest voltage selected from the set of voltages to the second voltage rail via the first voltage rail in response to the activation of the first PMOS device. In some embodiments, the activation of the first PMOS device is triggered by a first combinational logic portion, and the activation of the second PMOS device is triggered by a second combinational logic portion logically triggered by the first combinational logic portion.

In some embodiments, the method can include selecting a voltage of the first voltage rail from a plurality of voltages separate from the charge pump voltage, and can include electrically isolating, during the second time period and using the first PMOS device, the first voltage rail from the second voltage rail in response to the deactivation of the first PMOS device. The method can also include electrically isolating, during the first time period and using the second PMOS device, the charge pump voltage from the second voltage rail in response to deactivation of the second PMOS device. In some embodiments, the method can include selecting a voltage of the first voltage rail from a plurality of voltages including a voltage of an input signal on a first side of the pass gate and an output signal on a second side of the pass gate.

In some embodiments, the method can include receiving a charge pump control signal where the activation of the first PMOS device and the activation of the second PMOS device are triggered by the charge pump control signal, and can include receiving a switch control signal separate from the charge pump control signal. The method can include triggering deactivation of the pass gate via a plurality of driver circuits and a level shifter, during at least one of the first time period or the second time period.

In yet another general aspect, an apparatus can include a first voltage rail, a second voltage rail, and a pass gate having a gate coupled to the second voltage rail. The apparatus can include a PMOS device coupled between the first voltage rail and the second voltage rail, and a voltage selector coupled to the second voltage rail and configured to apply a voltage from a set of voltages to the gate of the pass gate via the PMOS device and the second voltage rail. The apparatus can also include a charge pump device configured to apply a charge pump voltage to the gate of the pass gate via the second voltage rail.

In some embodiments, the pass gate is maintained in an on-state by the voltage applied by the voltage selector and maintained in the on-state by the charge pump voltage applied by the charge pump device. In some embodiments, the PMOS device is a first PMOS device, and the apparatus can include a second PMOS device coupled to the charge pump device where the charge pump voltage is applied to the gate of the pass gate in response to the second PMOS device being activated, and the charge pump voltage is greater than each of the voltages from the set of voltages.

In some embodiments, the charge pump device is a first charge pump device, and the charge pump voltage is a first charge pump voltage where the gate is a gate of a first MOSFET device included in the pass gate. The apparatus can also include a second charge pump device configured to apply a second charge pump voltage different from the first charge pump voltage to a gate of a second MOSFET device included in the pass gate. In some embodiments, the pass gate is configured to electrically couple a first node associated with a signal generator to a second node associated with a signal receiver when activated and configured to electrically isolate the first node from the second node when deactivated.

Implementations of the various techniques described herein may be implemented in digital electronic circuitry, or in computer hardware, firmware, software, or in combinations of them. Implementations may be implemented as a computer program product (e.g., a computer program tangibly embodied in an information carrier, a machine-readable storage device, a computer-readable medium, a tangible computer-readable medium), for processing by, or to control the operation of, data processing apparatus (e.g., a programmable processor, a computer, or multiple computers). In some implementations, a tangible computer-readable storage medium can be configured to store instructions that when executed cause a processor to perform a process. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry (e.g., an FPGA (field programmable gate array) or an ASIC (application-specific integrated circuit)).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data (e.g., magnetic, magneto-optical disks, or optical disks). Information carriers suitable for embodying computer program instructions and data include all forms of non-volatile memory, including by way of example semiconductor memory devices (e.g., EPROM, EEPROM, and flash memory devices); magnetic disks (e.g., internal hard disks or removable disks); magneto-optical disks; and CD-ROM and DVD-ROM disks. The processor and the memory may be supplemented by, or incorporated in special purpose logic circuitry.

Implementations may be implemented in a computing system that includes a back-end component (e.g., as a data server), or that includes a middleware component (e.g., an application server), or that includes a front-end component (e.g., a client computer having a graphical user interface or a Web browser) through which a user can interact with an implementation, or any combination of such back-end, middleware, or front-end components. Components may be interconnected by any form or medium of digital data communication (e.g., a communication network). Examples of communication networks include a local area network (LAN) and a wide area network (WAN) (e.g., the Internet).

Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Germanium (SiGe), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. An apparatus, comprising:
a first voltage rail;
a second voltage rail;
a first P-type metal-oxide-semiconductor field effect transistor (MOSFET) PMOS device between the first voltage rail and the second voltage rail, the first PMOS device configured to electrically couple the first voltage rail to the second voltage rail in response to the first PMOS device being activated;
a second PMOS device configured to provide a charge pump voltage produced by a charge pump device to the second voltage rail in response to the second PMOS device being activated and the first PMOS device being deactivated;

a pass gate; and
a driver circuit coupled to the pass gate and configured to operate based on a voltage of the second voltage rail.

2. The apparatus of claim 1, further comprising:
a first combinational logic portion configured to trigger activation of the first PMOS device in response to a charge pump control signal indicating that the charge pump device is disabled; and
a second combinational logic portion configured to trigger deactivation of the second PMOS device in response to the charge pump control signal indicating that the charge pump device is disabled.

3. The apparatus of claim 1, wherein the pass gate is configured to electrically couple a first node associated with a signal generator to a second node associated with a signal receiver when activated and configured to electrically isolate the first node from the second node when deactivated.

4. The apparatus of claim 1, wherein the first PMOS device and the second PMOS device are activated during mutually exclusive periods of time.

5. The apparatus of claim 1, further comprising:
a voltage selector coupled to the first voltage rail and configured to select a highest voltage from a set of voltages, the charge pump voltage being higher than each voltage from the set of voltages.

6. The apparatus of claim 1, further comprising:
a voltage selector configured to select a highest voltage from a set of voltages, the voltage selector configured to apply the highest voltage selected from the set of voltages to the second voltage rail via the first voltage rail in response to the first PMOS device being activated.

7. The apparatus of claim 1, wherein the pass gate is maintained in an active state based on the voltage of the second voltage rail when the first PMOS device is activated and when the second PMOS is activated.

8. The apparatus of claim 1, wherein the driver circuit is a first driver circuit configured to activate the pass gate based on the voltage of the second voltage rail and configured to deactivate the pass gate based on a ground voltage,
the apparatus further comprising:
a second driver circuit configured to receive a switch control signal configured to trigger activation and deactivation of the pass gate.

9. The apparatus of claim 8, further comprising:
a level shifter having functionality triggered by the second driver circuit, and configured to trigger the first driver circuit.

10. The apparatus of claim 1, further comprising:
an inverter configured to provide, in response to a charge pump control signal having an enable value, a high value based on the charge pump voltage, the charge pump voltage provided by the inverter triggering the deactivation of the first PMOS device.

11. A method, comprising:
electrically coupling, during a first time period and using a first P-type metal-oxide-semiconductor field-effect transistor (MOSFET) PMOS device, a first voltage rail coupled to a voltage selector to a second voltage rail in response to activation of the first PMOS device;
electrically coupling, during a second time period and using a second PMOS device, a charge pump voltage produced by a charge pump device to the second voltage rail in response to activation of the second PMOS device; and
activating a pass gate coupled to the second voltage rail based on a voltage of the second voltage rail during the second time period.

12. The method of claim 11, further comprising
receiving a charge pump control signal indicating a state of the charge pump device, the activation of the first PMOS device and the activation of the second PMOS device are triggered by the charge pump control signal.

13. The method of claim 11, further comprising
operating a driver circuit based on the voltage of the second voltage rail during the first time period and during the second time period.

14. The method of claim 11, further comprising:
selecting a highest voltage from a set of voltages using the voltage selector; and
applying the highest voltage selected from the set of voltages to the second voltage rail via the first voltage rail in response to the activation of the first PMOS device.

15. The method of claim 11, wherein the activation of the first PMOS device is triggered by a first combinational logic portion, and the activation of the second PMOS device is triggered by a second combinational logic portion logically triggered by the first combinational logic portion.

16. The method of claim 11, further comprising:
selecting a voltage of the first voltage rail from a plurality of voltages separate from the charge pump voltage;
electrically isolating, during the second time period and using the first PMOS device, the first voltage rail from the second voltage rail in response to the deactivation of the first PMOS device; and
electrically isolating, during the first time period and using the second PMOS device, the charge pump voltage from the second voltage rail in response to deactivation of the second PMOS device.

17. The method of claim 11, further comprising:
selecting a voltage of the first voltage rail from a plurality of voltages including a voltage of an input signal on a first side of the pass gate and an output signal on a second side of the pass gate.

18. The method of claim 11, further comprising
receiving a charge pump control signal, the activation of the first PMOS device and the activation of the second PMOS device are triggered by the charge pump control signal;
receiving a switch control signal separate from the charge pump control signal; and
triggering deactivation of the pass gate via a plurality of driver circuits and a level shifter, during at least one of the first time period or the second time period.

19. An apparatus, comprising:
a first voltage rail;
a second voltage rail;
a pass gate having a gate coupled to the second voltage rail;
a P-type metal-oxide-semiconductor field effect transistor (MOSFET) PMOS device coupled between the first voltage rail and the second voltage rail;
a voltage selector coupled to the second voltage rail and configured to apply a voltage from a set of voltages to the gate of the pass gate via the PMOS device and the second voltage rail; and
a charge pump device configured to apply a charge pump voltage to the gate of the pass gate via the second voltage rail.

20. The apparatus of claim 19, wherein the pass gate is maintained in an on-state by the voltage applied by the voltage selector and maintained in the on-state by the charge pump voltage applied by the charge pump device.

21. The apparatus of claim 19, wherein the PMOS device is a first PMOS device,
the apparatus further comprising:
a second PMOS device coupled to the charge pump device, the charge pump voltage being applied to the gate of the pass gate in response to the second PMOS device being activated, the charge pump voltage being greater than each of the voltages from the set of voltages.

22. The apparatus of claim 19, wherein the charge pump device is a first charge pump device, and the charge pump voltage is a first charge pump voltage, the gate is a gate of a first MOSFET device included in the pass gate,
the apparatus further comprising:
a second charge pump device configured to apply a second charge pump voltage different from the first charge pump voltage to a gate of a second MOSFET device included in the pass gate.

23. The apparatus of claim 19, wherein the pass gate is configured to electrically couple a first node associated with a signal generator to a second node associated with a signal receiver when activated and configured to electrically isolate the first node from the second node when deactivated.

\* \* \* \* \*